Dec. 14, 1965 W. SMEULERS 3,223,942

MEANS FOR INCREASING THE CATCH RANGE OF A PHASE DETECTOR IN AN AFC CIRCUIT

Filed Feb. 26, 1962

INVENTOR
WOUTER SMEULERS
BY Frank R. Trifari
AGENT 3,223,942

MEANS FOR INCREASING THE CATCH RANGE OF A PHASE DETECTOR IN AN AFC CIRCUIT

Wouter Smeulers, Eindhoven, Netherlands, assignor to North American Philips Company, Inc., New York, N.Y., a corporation of Delaware Filed Feb. 26, 1962, Ser. No. 175,443
Claims priority, application Netherlands, Mar. 13, 1961, 262,312
6 Claims. (Cl. 331—8)

The invention relates to a circuit of the type comprising an oscillator to be automatically stabilized on the frequency of a pulsatory control-signal and a phase corrector which is coupled with the oscillator and to which a control-voltage is fed which is derived from a phase detector, which comprises an electronic switch which is capable of conducting in two directions and which scans a comparison signal derived from the oscillator under the control of a pulsatory switching signal and supplies the scanned signal to a capacitor for producing a control-voltage which reduces the frequency difference between the control-signal and the comparison signal.

Such a circuit is known, for example from R.C.A. Review of September 1957, pages 293 to 307, particularly page 305, FIG. 10. In the device described in this review the switch is formed by a transistor, which is controlled at its base by the pulsatory control-signal. In the state in which the frequency difference of the control-signal exceeds the catching range of the phase detector, i.e., the maximum frequency difference which the phase detector is capable of correcting on the basis of the non-synchronized state, the output capacitor provides an alternating voltage of a frequency equal to the said frequency difference and having a mean value equal to zero.

The object of the invention is to provide a circuit of the above-described type in which the output voltage of the phase detector has a mean value differing from zero outside the catching range of the known device. The polarity of this voltage is a measure of the sense of the frequency difference, and this voltage is capable of reducing the frequency difference.

In accordance with the invention this is achieved by deriving the switching signal from a coincidence circuit controlled by the control-signal and a pulsatory signal corresponding with the comparison signal.

This circuit has the advantage that the catching range of the phase detector is considerably larger than with the known devices.

The invention will now be described more fully with reference to an embodiment shown in the drawing.

Figure 1:
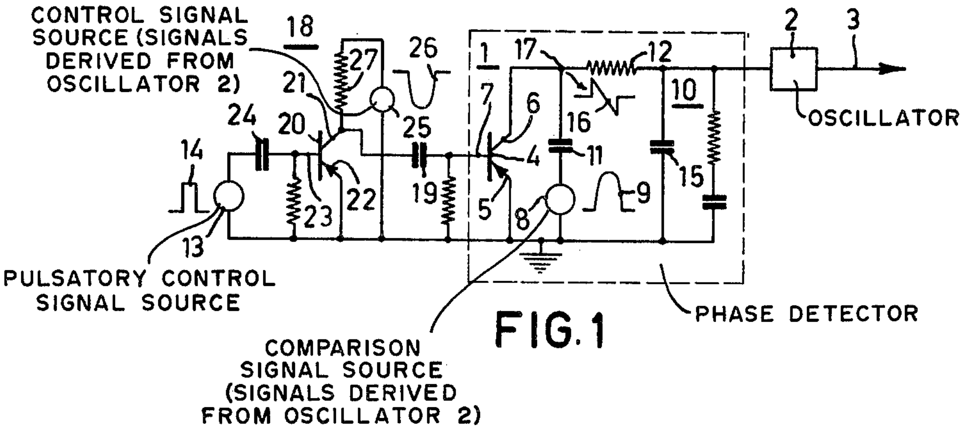
FIG. 1 shows one embodiment of a device according to the invention.

Referring to FIG. 1, reference numeral 1 designates a phase detector, 2 an oscillator to be stabilized on the frequency of a pulsatory control-signal and having a frequency corrector (not shown in detail). The oscillator 2 may be a control-oscillator of a line output stage of a television receiver, connected to conductors 3 (not shown).

The phase detector comprises a transistor 4, which is capable of conveying emitter-collector current in two directions. The current passes from an emitter electrode 5 to a collector electrode 6 or conversely in accordance with the polarity of the voltage applied between these two electrodes. The transistor is controlled at the base 7 by a pulsatory switching voltage. The polarity of the switching voltage is negative for a pnp-type transistor. The pulses render the transistor 4 conducting. The transistor 4 is preferably of a symmetrical type, in which the emitter and the collector have the same conductivity. In this case the collector may also operate as an emitter and there is no preferential direction of the current through the transistor. The phase detector comprises furthermore a source 8, which supplies the comparison signal. The source supplies periodic pulses of the waveform designated by 9. A sequence of these pulses is illustrated in FIG. 2*b*. The pulses are derived in known manner (not shown) from the oscillator 2. In a television receiver these pulses correspond with the line fly-back pulses of the line output stage. This is represented briefly by the source 8. The phase detector comprises furthermore a smoothing filter 10 and a differentiating circuit 11, 12. Reference numeral 13 designates a source supplying the pulsatory control-signal. The source supplies pulses of the waveform designated by 14, a sequence of which is illustrated in FIG. 2*c*. The pulses are derived in known manner (not shown) from the horizontal synchonization separator of a television receiver. This is represented briefly by the source 13. In the known circuit referred to, above, a source corresponding to the source 13 is directly connected to the base electrode of a transistor corresponding to transistor 4, however the pulses have a negative polarity. Thus each pulse of the source 4 changes over the transistor 4 to the conducting state.

The pulses of the source 8 are differentiated by the capacitor 11 in conjunction with the resistor 12. The input capacitor 15 of the smoothing filter 10 does not affect the differentiation, since its capacity is many times higher than that of the capacitor 11. At the junction 17 of the capacitor 11 and the resistor 12 a substantially linear voltage of the waveform designated by 16 occurs at each pulse from the source 8 for providing the bias for electrodes 5 and 6. In FIG. 2*a* the voltage variation at point 17 is plotted for a number of successive pulses from the source 8. This is the comparison signal proper, from which the control-signal is derived. The pulses from the source 8 occur in time intervals $t1$ to $t2$. When the transister 4 becomes conducting in such a time interval, the capacitor 11 is immediately charged to the instantaneous value of the voltage at point 17. The capacitor 15 is charged on an average to the same value as the capacitor 11. Owing to this method of scanning of the comparison signal by the transistor 4 the static phase characteristic of the phase detector—the relationship between the voltage at the capacitor 15 and the phase difference between the control-signal and the comparison signal, each point of the characteristic curve corresponding to a stationary condition—has the same form as the comparison signal designated by 16.

Figure 2:
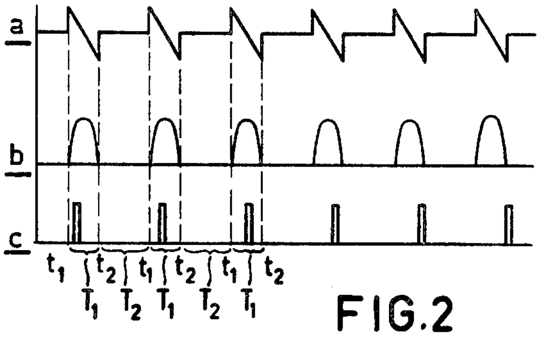
FIGS. 2 and 3 show voltage-time diagrams for explaining the embodiment shown in FIG. 1.

In the out-of-synchronisation state the phase difference between the comparison signal and the control-signal varies constantly. This state is illustrated in FIG. 2, from which it will be seen that the control-signal shown in FIG. 2*c* has a different position relative to the comparison signal shown in FIG. 2*a* during the successive time intervals $t1$–$t2$. Thus the capacitor 15 has produced across it a beat signal having a frequency equal to the frequency difference between the control-signal and the comparison signal.

Figure 3:
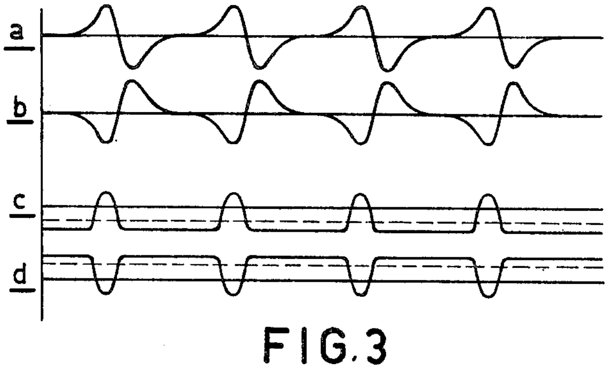

With control of the base of transistor 4 according to the known circuit, in one period of the beat signal the phase difference between the control-signal and the comparison signal passes from 0° to 360°. Thus the beat signal has, in one period, the same waveform as the phase characteristic. Since the phase difference varies constantly, no stationary state is attained, so that in one period the beat signal has a course which is more rounded off than the phase characteristic. FIG. 3*a* illustrates the beat signal corresponding to a case shown in FIG. 2 in which the frequency of the comparison signal exceeds that of the control-signal. If the sign of the frequency difference is the reverse, the beat signal has the course shown in FIG. 3*b*. From FIGS. 3*a* and 3*b* it appears, in addition, that with base control of transistor 4 according to the known circuit the mean value of the beat signal is equal to zero.

The value of the catching range of the phase detector is, of course, also determined by the frequency corrector and the controlled oscillator. If the frequency difference between the control-signal and the comparison signal lies in the catching range, one period of the beat signal has a duration such that within this period the frequency of the oscillator can be stabilized on the frequency of the control-signal.

In order to enlarge the catching region of the phase detector it is proposed in accordance with the invention not to supply the control-signal directly to the base of the transistor 4, but to supply it via a coincidence circuit 18. This circuit is controlled by the control-signal and a pulsatory signal corresponding to the comparison signal. At the simultaneous occurrence of a pulse of the two signals the coincidence circuit 18 supplies via the coupling capacitor 19 a release pulse to the base of the transistor 4.

The coincidence circuit 18 comprises a transistor 20, having a collector electrode 21, an emitter electrode 22 and a base electrode 23. The source 13 supplies via a capacitor 24 of high capacity pulses to the base electrode 23. The capacitor 24 is charged with such a polarity that the transistor is normally conducting and becomes non-conducting only at the occurrence of pulses from the source 13. A source 25 supplies pulses of the waveform 26, which correspond with the pulses from the source 8, but with opposite polarity; these pulses can be obtained in a similar manner from the line output stage of the television receiver and provide emitter to collecter bias for transistor 20. The pulses from the source 25 can be fed via the resistor 27 to the capacitor 19 for a time interval in which the transistor 20 is non-conducting. The duration of a pulse of the control-signal is shorter than the duration of a pulse from the source 25. The duration of a pulse at the collector electrode 21 is then equal to the duration of the first-mentioned pulse. The pulses from the sources 25 and 8 occur in the time intervals *t*1 and *t*2, as is illustrated in FIG. 2. These intervals are designated by T1, the intermediate time intervals by T2. The coincidence circuit supplies only a pulse when the pulse of the control-signal lies in the interval T1. In the out-of-synchronisation condition the pulses of the control-signal traverse in order of succession the time intervals T1 and T2. With the known circuit the transistor corresponding to transistor 4 is rendered conductive each time when a pulse of the control-signal occurs. Thus the capacitor corresponding to capacitor 15 is discharged each time in the time intervals T2 via the resistor and transistor corresponding to the resistor 12 and the transistor 4 respectively, so that the beat signal assumes the waveform illustrated in FIGS. 3*a* and 3*b*. By using the coincidence circuit 18 according to the invention described above it is ensured that the transistor 4 is non-conducting in the time intervals T2. This results in that the voltage at the capacitor 15 is maintained at the end of the time intervals T1 at the value then attained. The polarity of the voltage of the capacitor 15 at the instant, when pulses of the control-signal exceed the limit between the time intervals T1 and T2, depends upon the sense in which the time intervals T1 are traversed by the pulses. With the beat signal shown in FIG. 3*a* the polarity is negative and with the beat signal shown in FIG. 3*b* it is positive. In FIGS. 3*c* and 3*d* the variation of the beat signal is indicated when the coincidence circuit is used. FIG. 3*c* corresponds with FIG. 3*a* and FIG. 3*d* corresponds with FIG. 3*b*. The straight full line is at zero level and the dot-and-dash line indicates the mean value of the beat signal. Thus the capacitor 15 has produced across it a control-direct voltage reducing the frequency difference between the control-signal and the comparison signal, the said voltage displacing the frequency difference between the two signals into the catching range of the known circuit.

It should be noted that within the scope of the invention many modifications of the circuit arrangement are possible. Particularly many equivalent coincidence circuits known to those skilled in the art may be used to replace the coincidence circuit shown in FIG. 1. It is furthermore possible to produce the comparison signal 16 in a manner differing from that shown; use may be made, for example, to this end of a sawtooth voltage. This is rendered possible in that the coincidence circuit is capable of supplying a pulse only during the line fly-back pulse, so that only then the comparison between the control-signal and the comparison signal is performed. It is furthermore possible, in principle, to connect the main current path of the transistor 4 in series with the source 8 and the capacitor 15.

What is claimed is:

1. Means for producing a control voltage for stabilizing the frequency of an oscillator, comprising a source of synchronizing pulses, means for deriving from said oscillator first and second pulsatory signals of the same frequency as said oscillator, electronic switch means having a control input circuit and a bidirectional current output circuit, a capacitor, means connecting said capacitor and said means providing said first pulsatory signal serially to said output circuit, coincidence circuit means, means applying said synchronizing pulses and second pulsatory signals to said coincidence circuit to provide a switching signal, whereby said switching signal occurs only upon coincidence of said synchronizing pulses and second pulsatory signals, means applying said switching signal to said control input circuit whereby said output circuit is conductive only upon the occurrence of said switching signal, and means for deriving said control voltage from said capacitor.

2. Means for producing a control voltage for stabilizing the frequency of an oscillator, comprising a source of synchronizing pulses, means for deriving from said oscillator first and second pulsatory signals of the same frequency as said oscillator, a transistor having emitter, base and collector electrodes and being capable of passing emitter-collector current in either direction depending upon the polarity of potential applied between the emitter and collector electrodes, coincidence circuit means, means applying said synchronizing pulses and second pulsatory signal to said coincidence circuit means to provide a switching signal which occurs only upon detection of a coincidence by said coincidence circuit means, means applying said switching signal to said base electrode, whereby said transistor is conductive only during the occurrence of said switching signal, a capacitor, means applying said first pulsatory signal between the emitter and collector of said transistor by way of said capacitor, and means for deriving said control voltage from said capacitor.

3. The circuit of claim 2, in which said transistor is a symmetrical transistor.

4. Means for producing a control voltage for stabilizing the frequency of an oscillator, comprising a source of synchronizing pulses, means for deriving from said oscillator first and second pulsatory signals of the same frequency as said oscillator, a transistor having emitter, base and collector electrodes and being capable of passing emitter-collector current in either direction depending upon the polarity of the potential applied between the emitter and collector electrodes, a differentiating circuit comprising a capacitor and a resistor, with one end of said capacitor being connected to one terminal of said resistor, means applying said first pulsatory signal between said collector and emitter electrodes by way of said capacitor to differentiate the first pulsatory signal, coincidence circuit means, means applying said synchronizing pulses and second pulsatory signals to said coincidence circuit means to provide a switching signal, means applying said switching signal between the base and another electrode of said transistor whereby said transistor is conductive only upon coincidence of said synchronizing signal and second pulsatory signal, and means connected to the other terminal of said resistor for deriving said control voltage from said differentiating circuit.

5. The circuit of claim 4, in which said coincidence circuit means comprises a second transistor, means applying said synchronizing signal between the base and emitter of said second transistor, resistor means, means applying said second pulsatory signal between the emitter and collector of said second transistor by way of said resistor means, and means connecting the collector and emitter electrodes of said second transistor to the base and emitter electrodes respectively of said first-mentioned transistor.

6. Means for producing a control voltage for stabilizing the frequency of an oscillator, comprising a source of synchronizing pulses, means for deriving from said oscillator first and second pulsatory signals of the same frequency as said oscillator, a transistor having emitter, base and collector electrodes and being capable of passing emitter-collector current in either direction depending upon the polarity of potential applied between the emitter and collector electrodes, a first capacitor, means serially connecting said means providing said first pulsatory signal and said first capacitor between said emitter and collector electrodes, a resistor and a second capacitor connected serially between said emitter and collector electrodes with one end of said resistor being connected to one terminal of said first capacitor, coincidence circuit means, means applying said synchronizing pulses and second pulsatory signal to said coincidence circuit means to provide a switching signal, means applying said switching signal to said base electrode whereby said transistor is conductive only upon coincidence of said synchronizing signal and second pulsatory signal, and means for deriving said control voltage from said second capacitor.

References Cited by the Examiner

UNITED STATES PATENTS

| | | | |
|---|---|---|---|
| 3,032,720 | 5/1963 | Bruch et al. | 331—25 X |
| 3,127,570 | 3/1964 | Smeulers | 331—17 X |

ROY LAKE, *Primary Examiner.*

JOHN KOMINSKI, *Examiner.*

UNITED STATES PATENT OFFICE
CERTIFICATE OF CORRECTION

Patent No. 3,223,942 December 14, 1965

Wouter Smeulers

It is hereby certified that error appears in the above numbered patent requiring correction and that the said Letters Patent should read as corrected below.

Column 2, line 17, for "synchonization" read -- synchronization --; lines 23 and 24, strike out "4", each occurrence.

Signed and sealed this 17th day of January 1967.

(SEAL)
Attest:

ERNEST W. SWIDER
Attesting Officer

EDWARD J. BRENNER
Commissioner of Patents